(12) United States Patent
Allen et al.

(10) Patent No.: US 10,107,591 B2
(45) Date of Patent: Oct. 23, 2018

(54) TARGET MARKING SYSTEM

(71) Applicant: LaserMax, Inc., Rochester, NY (US)

(72) Inventors: Michael W. Allen, Shortsville, NY (US); Daniel J. Balonek, Bergen, NY (US)

(73) Assignee: Lasermax Inc, Rochester, NY (US)

( * ) Notice: Subject to any disclaimer, the term of this patent is extended or adjusted under 35 U.S.C. 154(b) by 0 days.

(21) Appl. No.: 14/960,931

(22) Filed: Dec. 7, 2015

(65) Prior Publication Data

US 2016/0084615 A1 Mar. 24, 2016

Related U.S. Application Data (60) Continuation of application No. 14/266,877, filed on May 1, 2014, now Pat. No. 9,207,043, which is a division of application No. 13/229,124, filed on Sep. 9, 2011, now Pat. No. 8,720,102.

(51) Int. Cl.
| | |
|---|---|
| *F41G 1/35* | (2006.01) |
| *F41G 3/06* | (2006.01) |
| *F41A 33/02* | (2006.01) |
| *F41G 1/34* | (2006.01) |
| *F41G 1/36* | (2006.01) |
| *H01S 5/34* | (2006.01) |

(52) U.S. Cl.
CPC ............... *F41G 1/35* (2013.01); *F41A 33/02* (2013.01); *F41G 1/34* (2013.01); *F41G 1/36* (2013.01); *F41G 3/06* (2013.01); *H01S 5/3402* (2013.01)

(58) Field of Classification Search
CPC ..... F41G 1/35; F41G 1/36; F41G 3/06; F41G 3/065; F41G 3/145; F41A 33/02
See application file for complete search history.

(56) References Cited

U.S. PATENT DOCUMENTS

| | | |
|---|---|---|
| 4,166,406 A | 9/1979 | Maughmer |
| 6,000,163 A | 12/1999 | Gordon |
| 6,234,045 B1 * | 5/2001 | Kaiser ................... F16F 7/1005 74/572.2 |
| 7,492,806 B2 | 2/2009 | Day et al. |
| 2006/0005447 A1 | 1/2006 | Lenner et al. |
| 2008/0212154 A1 * | 9/2008 | Feinsod ................ G02B 27/20 359/196.1 |
| 2011/0252681 A1 | 10/2011 | Houde-Walter et al. |
| 2011/0289810 A1 | 12/2011 | D'Souza et al. |
| 2012/0235902 A1 * | 9/2012 | Eisenhardt ............. A42B 3/042 345/156 |
| 2014/0283430 A1 | 9/2014 | Allen et al. |
| 2017/0059279 A1 * | 3/2017 | Houde-Walter .......... F41G 1/35 |

OTHER PUBLICATIONS

Office action for U.S. Appl. No. 13/229,124, dated Aug. 5, 2013, Allen et al, "Target Marking System", 6 pages.
Office Action for U.S. Appl. No. 14/266,877, dated Sep. 16, 2014, Michael W. Allen, "Target Marking System", 5 pages.

* cited by examiner

*Primary Examiner* — Stephen Johnson
(74) *Attorney, Agent, or Firm* — Lee & Hayes, PLLC (57) ABSTRACT

A method of controlling a target marking system includes emitting a beam with a beam source associated with a target marker. The method also includes sensing movement of the target marker, and modifying operation of the beam source based on the sensed movement. Such modification changes a characteristic of the emitted beam.

16 Claims, 4 Drawing Sheets

TARGET MARKING SYSTEM

CROSS-REFERENCE TO RELATED APPLICATIONS

This application is a continuation of U.S. application Ser. No. 14/266,877, filed May 1, 2014, now U.S. Pat. No. 9,207,043, issued Dec. 8, 2015, which is a divisional of U.S. application Ser. No. 13/229,124, filed Sep. 9, 2011, now U.S. Pat. No. 8,720,102, issued May 13, 2014. The entire disclosures of each of the above applications are incorporated herein by reference.

STATEMENT REGARDING FEDERALLY SPONSORED RESEARCH OR DEVELOPMENT

Not applicable.

REFERENCE TO A "SEQUENCE LISTING"

Not applicable.

BACKGROUND OF THE INVENTION

Field of the Invention

The present disclosure relates to target marking systems and, in particular, to target marking systems responsive to sensed movement.

Description of Related Art

Beam sources, such as quantum cascade lasers and other like lasers, are known to be inefficient. In particular, although these beam sources may be capable of emitting a beam of radiation in the thermal or optical band, such beam sources generally require large amounts of power, and produce a large amount of heat, during operation. These inefficiencies are compounded when the beam sources are used for extended periods of time and/or when such beam sources are used to emit a beam at a high duty cycle. As a result, it is difficult to use such beam sources in combat, law enforcement, and/or other like applications since these applications typically require the use of a portable power source, and it is difficult to provide such beam sources with a portable power supply having sufficient capacity for extended use.

To compensate for these difficulties, such beam sources are typically controlled to emit a pulsed beam, thereby reducing the average power draw and heat generation of the beam source, while increasing the visibility of the emitted beam. It may also be possible to reduce the pulse rate and/or the duty cycle of the beam source, thereby further reducing the power required and heat generated by the beam source. However, such reduced pulse rates and/or duty cycles may not be appropriate for all applications. In particular, when employing the beam source as a component of a target marker, a relatively high pulse rate and/or duty cycle may be required to mark targets while the target marker is being moved rapidly by the user. Such rapid movement may occur when, for example, the user sweeps the target marker from left to right upon entering a room or other potentially dangerous environment. A high pulse rate and/or duty cycle may also be required to mark rapidly moving targets since, to mark such targets, the user may also be required to sweep the target marker to maintain a mark on the target.

The various embodiments set forth in the present disclosure are directed toward overcoming the problems discussed above.

BRIEF SUMMARY OF THE INVENTION

In an exemplary embodiment of the present disclosure, a method of controlling a target marking system includes emitting a beam with a beam source associated with a target marker. The method also includes sensing movement of the target marker, and modifying operation of the beam source based on the sensed movement. Such modification changes a characteristic of the emitted beam.

In a further exemplary embodiment of the present disclosure, a method of controlling a target marking system includes emitting a beam with a beam source associated with a target marker. The method also includes sensing angular movement of the target marker, and increasing a pulse rate of the emitted beam in response to the sensed movement.

In another exemplary embodiment of the present disclosure, a target marking system includes a target marker. The target marker includes a beam source configured to emit a beam. The target marker also includes a motion sensor configured to sense movement of the target marker and to generate a signal indicative of the sensed movement. The target marker further includes a controller in communication with the beam source and the motion sensor. The controller is configured to modify operation of the beam source in response to the signal generated by the motion sensor. Such modification changes a characteristic of the emitted beam.

In another exemplary embodiment of the present disclosure, a target marking system includes a target marker configured to be coupled to a firearm. The target marker includes a beam source configured to emit a beam. The target marker also includes a motion sensor configured to sense movement of the firearm and to generate a signal indicative of the sensed movement. The target marker further includes a controller in communication with the beam source and the motion sensor. The controller is configured to modify operation of the beam source in response to the signal generated by the motion sensor. Such modification changes a characteristic of the emitted beam.

DETAILED DESCRIPTION OF THE INVENTION

Figure 1:
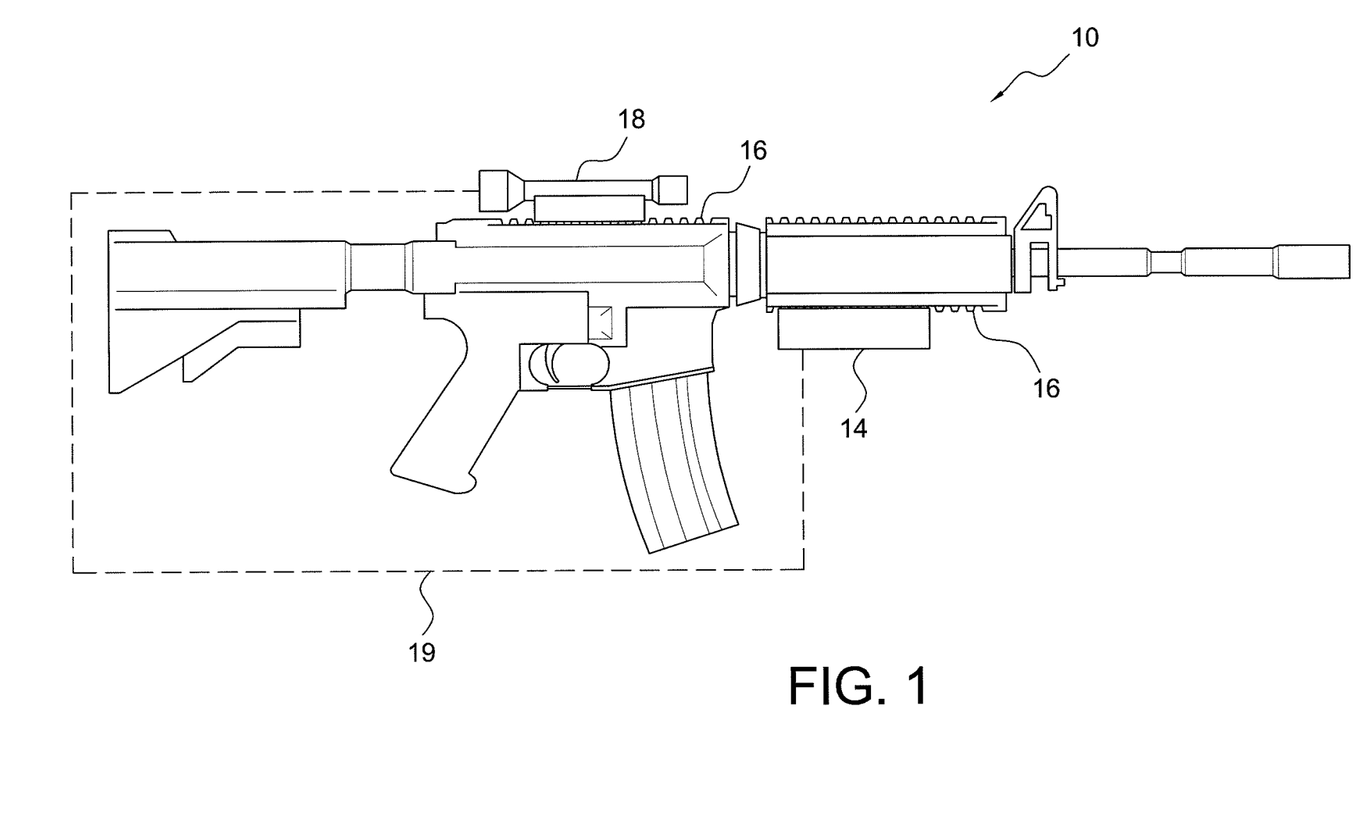
FIG. 1 is a schematic view of a target marking system according to an exemplary embodiment of the present disclosure.

FIG. 1 illustrates a target marking system 10 according to an exemplary embodiment of the present disclosure. As shown in FIG. 1, an exemplary target marking system 10 may include a target marker 14 and an imager 18. The target marker 14 and/or the imager 18 may be configured to be coupled to a firearm 12 via one or more rails 16 of the firearm 12. In such exemplary embodiments, the target marking system may or may not include the firearm 12. Alternatively and/or additionally, at least one of the target marker 14 and the imager 18 may be configured for handheld use. In a further exemplary embodiment, the target marker 14 and/or the imager 18 may be mounted to a helmet, a rucksack, and/or other like article worn by a user. In still further exemplary embodiments in which the target marker 14 is used to emit a beam having a wavelength distinguishable by a human eye, the imager 18 may be omitted from the target marking system 10.

The firearm 12 may comprise any of a variety of handheld, side, and/or small firearms known in the art. Such firearms 12 include, but are not limited to, pistols, rifles, shotguns, automatic arms, semi-automatic arms, and bows. For example, the target marker 14 and/or the imager 18 may be configured to mount to any known sidearm, as well as any known dismounted crew-served weapon, such as machine guns and the like.

The rails 16 may comprise any of a variety of clamping or mounting mechanisms such as a Weaver-style Picatinny rail or dove tail-style rail. As shown in FIG. 1, the firearm 12 may include one or more rails 16 to facilitate coupling the various components of the target marking system 10 to the firearm 12.

The target marker 14 may be, for example, any device capable of emitting a signal in the form of one or more thermal or optical beams, pulses, or other identifiable signal types. Such an optical beam may have a wavelength between approximately 0.3 µm and approximately 2 µm, and such a thermal beam may have a wavelength between approximately 2 µm and approximately 30 µm. In addition, the signal emitted by the target marker 14 can be a temporally modulated signal or a temporally encoded signal, wherein the temporally encoded signal can be encrypted or unencrypted. For ease of description, the generic term "beam" will be used for the duration of this disclosure to refer to the various types of signals, beams, pulses, and/or other emitted radiation described above unless otherwise specified.

In an exemplary embodiment, the target marker 14 may emit a beam 34 (FIG. 2) having a wavelength between approximately 0.3 µm and approximately 30 µm, and the beam 34 may be detected by the imager 18 within a range of approximately 4 km or greater. In additional exemplary embodiments, the beam 34 may be detected by the imager 18 within a range of approximately 1 m or greater. Although the target marker 14 and imager 18 are shown in FIG. 1 as separate and independent components of the target marking system 10, in further exemplary embodiments, the target marker 14 may be cooperatively or integrally connected to the imager 18 so as to form a one-piece component of the target marking system 10.

The imager 18 may have any of a variety of components and/or configurations useful in capturing the beam 34 and converting the beam into a visible image. In general, the imager 18 may include at least one of a sensor, a focusing lens, a display device, a power supply. These components have been omitted from FIG. 1, but are shown schematically in FIG. 8.

Figure 8:
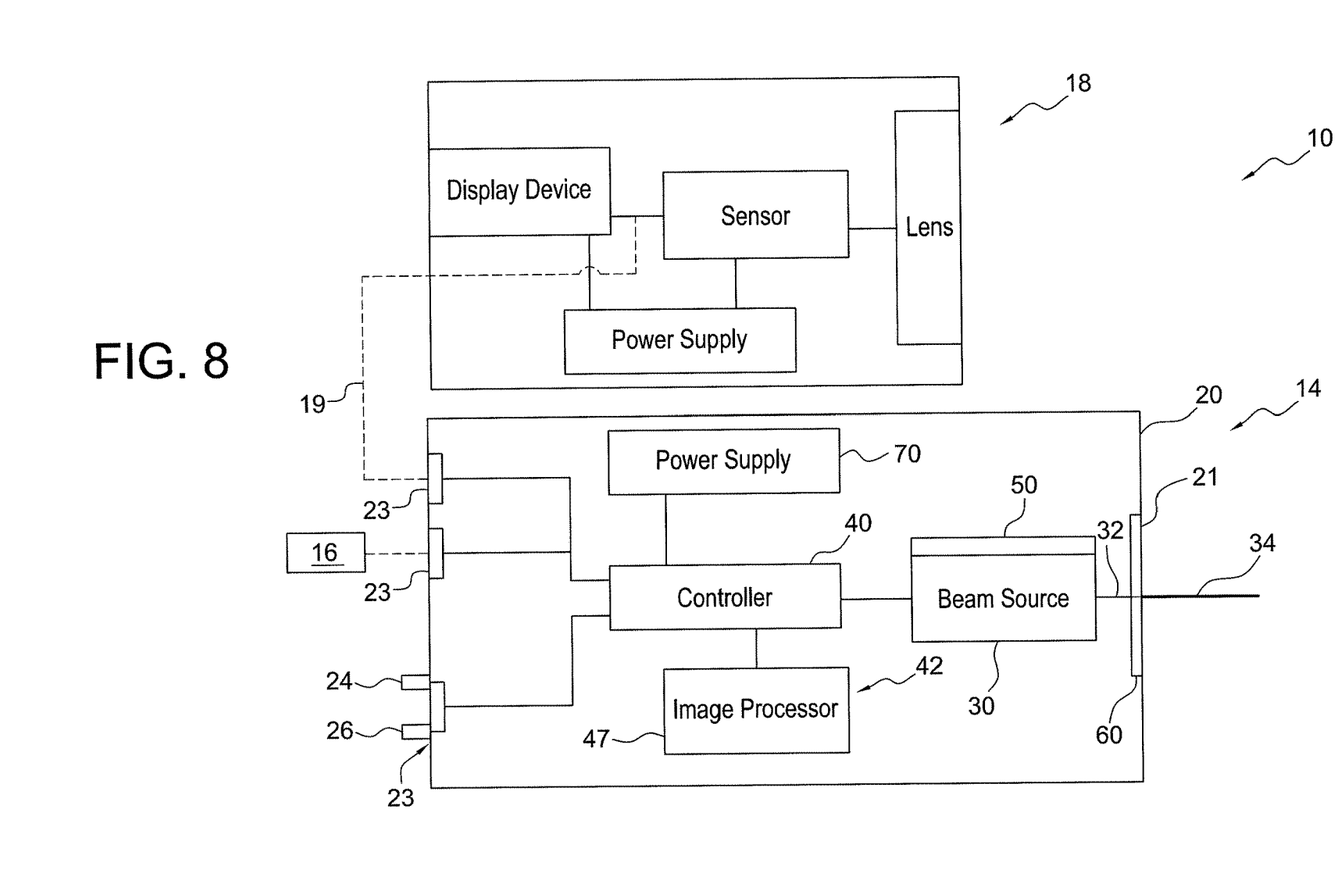
FIG. 8 is a schematic view of a target marking system according to another exemplary embodiment of the present disclosure.

The sensor of the imager 18 (often referred to as a "camera") may react to infrared radiation impinging thereon, and may be configured to convert the impinging radiation into a visible image. For example, the sensor may be configured to sense thermal radiation emitted by an area of interest, and convert the emitted radiation into a visible thermal image of the area. In such a thermal image, hotter areas appear in a different color than cooler areas. For example, a hotter target may appear substantially white while a relatively cooler surrounding environment may appear substantially black or gray. Such an exemplary sensor may comprise, for example, a barium strontium titanate ("BST") detector developed by the Raytheon Company of Lexington, Mass. Such an exemplary sensor may also comprise a microbolometer with a vanadium oxide ("VOx") or an amorphous silicon ("aSi") sensing material, such as the Thermal-Eye™ X-50 sold by Morovision Night Vision, Inc., of Laguna Hills, Calif. Such an exemplary sensor may further comprise a focal plan array ("FPA") of independent pixels. The sensor may send signals to the display device via one or more connections therebetween, and such signals may include information indicative of a field of view of the sensor, the lens, and/or of the imager 18 generally.

The focusing lens of the imager 18 may be any lens, filter, or other known optical device configured to focus light onto the sensor. The lens may be selected based on the desired quality of the resulting thermal image. For example, a wider lens may have a smaller f-number and may be capable of producing an image having increased image quality. An exemplary focusing lens may be constructed from Zinc Sulfide or Germanium, and such a lens may provide a field of view up to approximately 60 degrees.

The display device of the imager 18 may comprise any component through which the resultant thermal image is provided to the user. In an exemplary embodiment, the display device may comprise an active matrix liquid crystal display ("LCD"). In an additional exemplary embodiment, the display device may comprise an organic light emitting diode display (OLED"). The power supply of the imager 18 may comprise any type of battery known in the art. For example, a NiMH battery, an alkaline battery, or similar rechargeable battery can be used in a portable imager 18. Alternatively, a power supply of the target marker 14 may be configured to provide power to the imager 18 via a data and/or power connection 19. In still further exemplary embodiments, power may be transferred between the imager 18, target marker 14, and/or other power supplies (not shown) via the rails 16. In such exemplary embodiments, the rails 16 may be any type of "powered rail" known in the art. As shown in FIG. 8, the connection 19 may also connect the display device, the sensor, and/or other components of the imager 18 to the target marker 14. For example, signals, data, and/or information may be transferred between components of the imager 18 and components of the target marker 14 via the connection 19.

Figure 2:
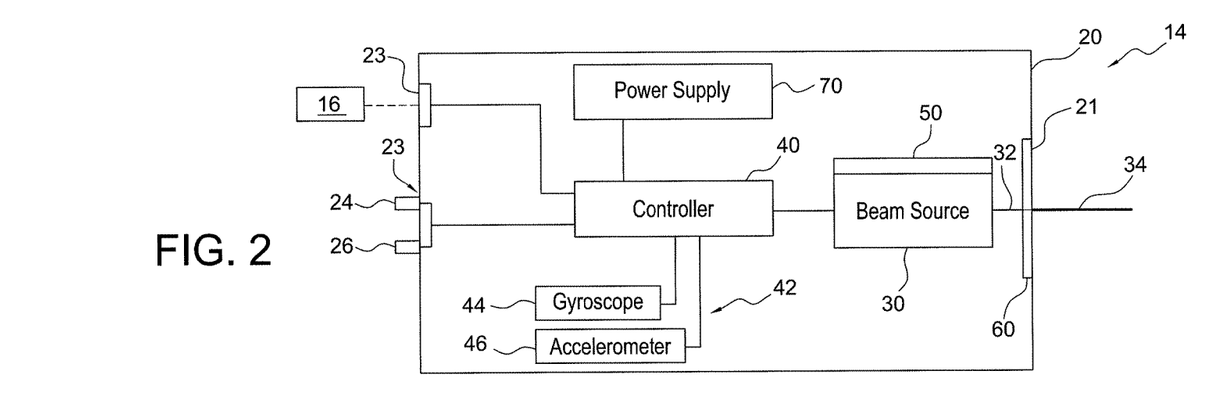
FIG. 2 is a schematic view of a target marker according to an exemplary embodiment of the present disclosure.
Figure 3:
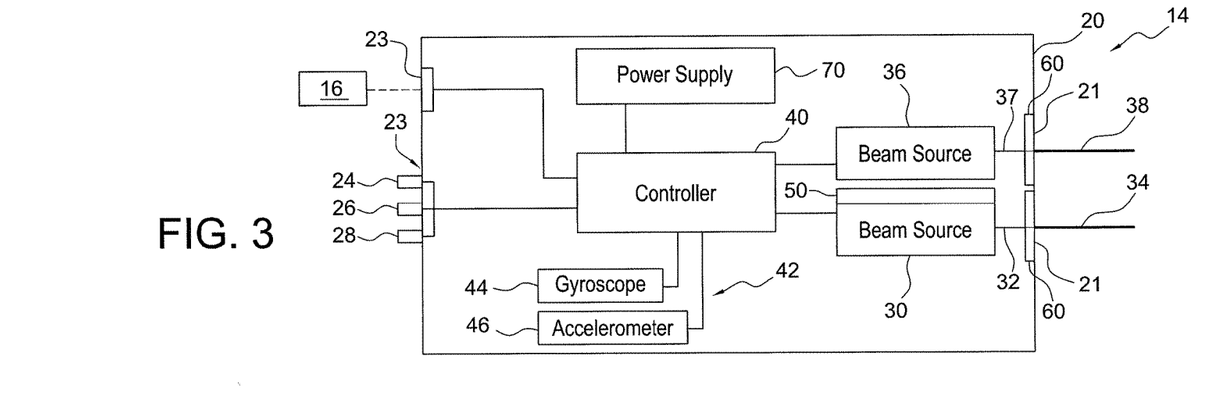
FIG. 3 is a schematic view of a target marker according to another exemplary embodiment of the present disclosure.

As shown in FIGS. 2, 3, and 8, an exemplary target marker 14 may comprise one or more beam sources 30, 36 known in the art configured to emit a respective beam 34, 38 in the optical and/or the thermal band. At least one of the beam sources 30, 36 of the target marker 14 may comprise a laser, such as a quantum cascade laser ("QCL") or other known laser. For ease of description, the exemplary embodiment of FIG. 2 having a single beam source 30 will be referred to for the duration of this disclosure unless otherwise specified. The target marker 14 may also include a housing 20, a controller 40, a cooler 50, a lens 60, a power supply 70, and/or a motion sensor 42.

The housing 20 may be configured for handheld use or firearm mounting. The housing 20 may be configured to enclose at least one of the beam source 30, the controller 40, the cooler 50, the lens 60, the power supply 70 and the motion sensor 42. In an exemplary embodiment, the housing 20 may enclose and/or otherwise retain all of the target marking system components required for operation of the beam source 30. In such exemplary embodiments, the target marker 14 may be a self-contained portable device.

The housing 20 may include one or more apertures 21 configured to permit passage of the beam 34 out of the housing 20. In addition, the target marker 14 may include one or more switches, connectors, or ports 23 for controlling, activating, deactivating, and/or powering the target marker 14. The ports 23 may comprise, for example, an on/off switch 24, a switch or other like control 26 for selecting a mode of operation of the beam source 30, and/or a power connector configured to assist in connecting the target marker 14 to, for example, a powered rail 16 of the firearm 12 or to another external power supply. In an exemplary embodiment, the control 26 may assist in switching between a constant beam operation of the beam source 30 and a pulsed beam operation of the beam source 30. Additionally, as shown in FIG. 3, in exemplary embodiments in which the target marker 14 includes more than one beam source 30, 36, the target marker 14 may include at least one beam source selector 28 configured to assist in selecting and/or deselecting the one or more beam sources 30, 36 for use. Each of the ports 23 may be connected to the controller 40 through any known electrical connection such that power, control commands, data, or other signals may be communicated between the ports 23 and the controller 40.

With continued reference to FIG. 2, the housing 20 may be formed from any of a variety of rigid material such as composites, laminates, plastics, or metals. Such metals may include, for example, aluminum or stainless steel. In an exemplary embodiment, the housing 20 may be formed through an extrusion process. In additional exemplary embodiment, the housing 20 can be machined such as by electrical discharge machining ("EDM") or formed through a molding process if composites, laminates, or plastics are employed for formation of the housing 20. The housing 20 may be substantially watertight so as to protect the components disposed therein from water or other harmful contaminants found in rugged environments such as combat arenas. For example, the housing 20 may be hermetically sealed and/or may include at least one hermetically sealed compartment therein. The beam source 30 and/or other components of the target marker 14 may be maintained in this hermetically sealed environment during use. In such exemplary embodiments, the beam source 30 and/or other components of the target marker 14 may be disposed within the hermetically sealed compartment of the housing 20.

The housing 20 may be configured to interface with any of the rails 16 described above, and may include one or more latches, locks, clamps, quick release devices, and/or other known mechanisms (not shown) commonly used to mount and/or otherwise couple like devices to known firearms 12.

The lens 60 may comprise any known divergent, convergent, collimating, and/or other type of lens known in the art. As shown in FIG. 2, the lens 60 may be disposed optically downstream of the beam source 30 and within the beam path 32 so as to condition the beam 34 in any desirable way. The lens 60 may be disposed in the beam path 32 such that, in one configuration, the lens 60 is retained substantially within the housing 20. However, it is contemplated that the lens 60 can form an interface between the interior and the exterior of the housing 20. The lens 60 can be configured to focus the beam 34 at a particular point. In further exemplary embodiments, the lens 60 can be a dedicated collimator, thereby collimating the beam 34 along the path 32. The lens 60 may be formed of a material substantially transparent to the wavelength of the beam emitted by the beam source 30.

In addition to the lens 60, the target marker 14 may also include one or more windows, domes, diffraction gratings, filters, prisms, mirrors, lenses, and/or other like optical components, or combinations thereof, disposed optically downstream of the beam source 30 and within the beam path 32. Due to their position along and/or within the beam path 32, and optically downstream of the beam source 30, the emitted beam 34 may pass through, be shaped by, and/or otherwise optically interact with such additional optical components before exiting the housing 20. In an exemplary embodiment, one or more lenses 60 of the type described herein may be positioned in the beam path 32 and optically upstream of a window, dome, or other like optical component. The beam path 32 may extend from the beam source 30, through a portion of the housing 20, to pass to the exterior of the housing 20.

In exemplary embodiments in which at least one of the beam sources 30, 36 shown in FIGS. 2 and 3 comprises a QCL, it is understood that such a QCL may exhibit the electrical behavior of a semiconductor material which can be described with the band model. This model states that various energy ranges, or energy bands, are available to the electrons of the semiconductor material, and that the electrons of the semiconductor material can essentially take on any energy value within the energy bands. Various bands can be separated from one another by a band gap, i.e., an energy band with energy values the electrons cannot possess. If an electron changes from a higher energy band to a lower energy band, energy corresponding to the difference of the energy values of the electron before and after the change, which is also called "transition", is released. The energy difference can be released in form of photons. The band with the highest bound-state energy level, which is fully filled with electrons at a temperature of 0° Kelvin, i.e., the so-called valence band, and the conduction band that is energetically above the valence band, which is unfilled at 0° Kelvin, as well as the band gap between them are of special significance for a semiconductor material.

In the cascades of QCLs, the semiconductor materials for the barrier layers and the quantum wells are selected such that the lower conduction band edge of the barrier material lies higher in energy than the lower conduction band edge of the quantum well material. The lower conduction band edge represents the lowest energy value that an electron can assume within the conduction band. The energy difference between the energy of the lower conduction band edge of the barrier material and the lower conduction band edge of the quantum well material is also called the conduction band discontinuity. As a result of this selection, the electrons of the quantum wells cannot readily penetrate the barrier layers and are therefore enclosed in the quantum wells. The electrons can only "tunnel" through a barrier layer into an adjacent quantum well in a quantum-mechanical process, with the probability of the occurrence of a tunneling process depending on the height of the conduction band discontinuity and the thickness of the barrier layer between the two quantum wells.

In the quantum well, the behavior of the electrons enclosed in the well is determined by quantum mechanics effects due to the small thickness of the layer (only a few nanometers). The electrons in an energy band of the quantum well can no longer assume any energy value within the energy range of the band, but rather are confined to the energy values of specific energy levels, i.e., sub-bands. The energetic differences between the individual sub-bands are particularly high if the quantum well is very thin and the conduction band discontinuity is high. The electron energy does not change continuously, but rather jumps from one sub-band to the next. The electron can change from one energy level to the other energy level only if the energy increase or the energy decrease suffered by an electron corresponds precisely to the difference of the energy values of two sub-bands. Transitions from one energy level to another energy level within one and the same band are called intersubband transitions. In the cascades of the QCL, the emission of laser radiation occurs at these intersubband transitions. For emission of beams having wavelengths between approximately 2.9 µm and 5.3 µm at room temperature, the QCL 30 as set forth in U.S. Publication No. 2005/0213627, published Sep. 29, 2005, assigned U.S. patent application Ser. No. 11/061,726, filed Feb. 22, 2005, is hereby expressly incorporated by reference.

In further exemplary embodiments, at least one of the beam sources 30, 36 shown in FIGS. 2 and 3 may comprise an infrared laser (such as at 830 nm) and/or a visible laser (400 nm to 750 nm), such as a model HL6321 MG laser manufactured by Hitachi. In further exemplary embodiments, at least one of the beam sources 30, 36 may comprise a carbon dioxide laser. Such lasers may be useful in any of the applications discussed herein, and may be configured for use in conjunction with any of the target marking systems 10 discussed herein. In exemplary embodiments in which the target marker 14 includes more than one beam source 30, 36, the beam sources 30, 36 may be operated and/or otherwise controlled independently. For example, each of the beam sources may emit respective beams 34, 38 having different wavelengths, pulse rates, pulse widths, duty cycles, and/or other characteristics.

With continued reference to FIG. 2, in exemplary embodiments, the beam source 30 can be tuned to provide an emitted beam 34 of a specific wavelength, pulse rate, pulse width, duty cycle, and/or other characteristic easily recognizable by friendly and/or allied forces. Tuning of the beam 34 emitted by the beam source 30 can be accomplished by locating a grating (not shown) in the beam path 32. The grating can be adjustable to allow selective transmission of a given wavelength, or fixed to transmit only a single wavelength. Although the signature of the beam 34 emitted by the beam source 30 may be preset, the signature, wavelength, frequency, pulse pattern, and/or other identifiable and distinguishable characteristics of the beam 34 may be easily tunable in the field and/or during use. Such ease of tunability may substantially reduce or eliminate, for example, the ability of enemy forces to disguise foe target markers as friendly target markers 14. In addition to the grating discussed above, it is understood that the controller 40 may be configured to assist in tuning and/or otherwise controlling the output of the beam source 30.

The controller 40 can be constructed to provide either pulsed or continuous operation of the beam source 30. The pulse rate, pulse width, duty cycle, wavelength, compliance voltage, current, and/or other parameters associated with operation of the beam source 30 may be selected and/or modified by the controller 40 to minimize power consumption of and heat generation by the beam source 30. These parameters may also be selected to produce a desirable beam signature for friend or foe identification. The controller 40 may be located within the housing 20, and may be operably connected to the beam source 30, the cooler 50, the motion sensor 42, and/or the power supply 70. The controller 40 may also be connected to the one or more ports 23 discussed above. The controller 40 may include a pulse generator, an amplifier, a pulse switcher, and/or other known driver components.

The controller 40 may enable operation of the beam source 30 as a pulsed laser, such as by passive, active, or controlled switching. Although specific values depend upon the particular beam source 30 and intended operating parameters, it is contemplated the peak current draw of the beam source 30 during operation at a constant pulse rate may be between approximately 1 amp and approximately 10 amps, with an average current draw between approximately 0.01 amps and approximately 3 amps. As the voltage required to maintain such a pulse rate may be between approximately 9 volts and approximately 15 volts, approximately 9 W and approximately 150 W peak power may be consumed. Operating the beam source 30 within such parameters may result in substantial power consumption as well as heat generation. Accordingly, in an exemplary embodiment, the controller 40 may be configured to modify the operation of the beam source 30 such as by reducing and/or limiting at least one of the duty cycle and the pulse rate of the emitted beam 34 in situations where the target marker 14 remains substantially stationary during use. In such embodiments, the controller 40 may also be configured to modify operation of the beam source 30 to temporarily increase the duty cycle and/or the pulse rate in response to movement of the target marker 14. In this way, power consumption and heat generation may be reduced while maintaining sufficient performance and functionality of the target marker 14 in a range of target marking applications.

In an exemplary embodiment, the beam source 30 may be controlled to operate at a pulse rate between approximately 1 Hz and approximately 30 Hz, and in additional exemplary embodiments, a desired pulse rate may be between approximately 1 Hz and approximately 10 Hz. The pulse rate and/or the duty cycle of the beam source 30 may be varied by the controller 40 in response to one or more signals received from the motion sensor 42 indicative of sensed movement. In addition, the beam source 30 may be controlled to emit a beam 34 having a pulse width between approximately 1 ms and approximately 500 ms. In still further exemplary embodiments, the pulse width of the emitted beam 34 may be less than 1 ms. In exemplary embodiments, the controller 40 may vary the pulse rate and/or the duty cycle in response to the signals received from the motion sensor 42 while maintaining a constant pulse width.

The power supply 70 may include at least one battery. Depending upon the anticipated power requirements, available space, and weight restrictions, such batteries can be N-type, AA, or AAA batteries. Additionally, a lithium/manganese dioxide battery such as military battery BA-5390/U, manufactured by Ultralife Batteries Inc. of Newark, N.Y. can be used with the target marker 14. It is understood that any type of power supply 70, preferably portable and sufficiently small in size for use with any of the devices discussed herein, can be utilized. The battery-type power supply 70 can be disposable or rechargeable.

The power supply 70 may be located within or external to the housing 20. In one configuration, the housing 20 may include a battery compartment sized to operably retain the power supply 70. Such a battery compartment may be substantially water-tight and/or hermetically sealed. The battery compartment can be formed of a weather resistant, resilient material such as plastic, and shaped to include receptacles for receiving one or more batteries or other power storage devices. Further, the battery compartment may be selectively closeable or sealable to prevent water, mud, dirt, sand, and/or other like environmental contaminants from entering the compartment.

The power supply 70 may be operably connected to the controller 40 and can be controlled by or utilized under driver commands. Thus, the amount of power delivered by the power supply 70 to the beam source 30 can be controlled or varied to alter the output of the beam source 30.

The cooler 50 may be disposed in thermal contact with the beam source 30. The cooler 50 may be disposed within the housing 20, and may be employed to maintain the beam source 30 at a desirable operating temperature. In an exemplary embodiment, the cooler 50 may assist in cooling the beam source 30 to approximately room temperature, or between approximately 65° Fahrenheit and approximately 85° Fahrenheit. In additional exemplary embodiments, the cooler 50 may be configured to cool the beam source 30 to temperatures below room temperature, such as to approximately 32° Fahrenheit or lower. In such exemplary embodiments, one or more barriers, seals, walls, compartments, absorbent materials, and/or other like components may be employed within the housing 20 proximate the beam source 30 to assist in isolating the beam source 30 from condensation or moisture formed on and/or by the cooler 50.

The cooler 50 can be a passive device or an active device. A passive cooler 50 may comprise a heat sink, a phase change element, a radiator, and/or one or more fins configured to dissipate thermal energy from the beam source 30. As used herein, a "phase change element" may include any element and/or material configured to absorb heat energy and utilize the absorbed energy to change the phase of, for example, a solid to a liquid. An active cooler 50 may comprise a Peltier module, a Stirling device, and/or a thermoelectric cooler.

The motion sensor 42 may comprise any device capable of sensing movement of the target marker 14, the imager 18, and/or of the firearm 12 to which the target marker 14 and/or the imager 18 are coupled. While the target marker 14 and/or the imager 18 are coupled to the firearm 12, movement of the target marker 14 and/or the imager 18 may be directly related to and/or may result from movement of the firearm 12 by a user 48 (FIGS. 4-7). For ease of description, however, movement of the target marker 14 shall be described for the duration of this disclosure unless otherwise specified. Such movement is illustrated in FIGS. 4-7.

The motion sensor 42 may be configured to sense, for example, linear movement and/or angular movement of the target marker 14. In exemplary embodiments, the motion sensor 42 may comprise one or more accelerometers 46, velocitometers, and/or other like devices configured to sense linear movement. Additionally, and/or alternatively, the motion sensor 42 may comprise one or more gyroscopes 44, rotation sensors, and/or other like devices configured to sense angular movement. In further exemplary embodiments, the motion sensor 42 may comprise one or more image processors 47 configured to sense linear and/or angular movement. In still further exemplary embodiments, the motion sensor 42 may comprise one or more microelectronic machines or other like devices configured to sense the linear and/or angular movement described herein.

Figure 6:
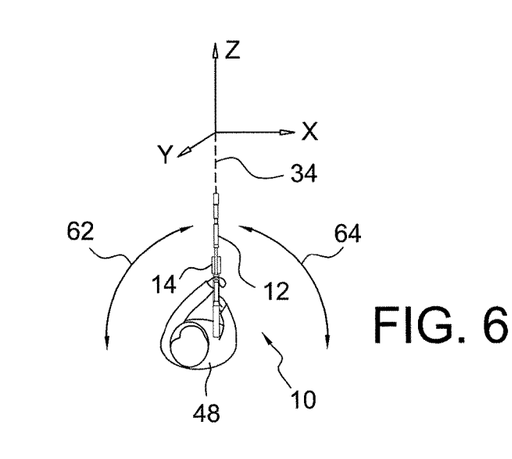
FIG. 6 is an additional view of the system shown in FIG. 1.
Figure 7:
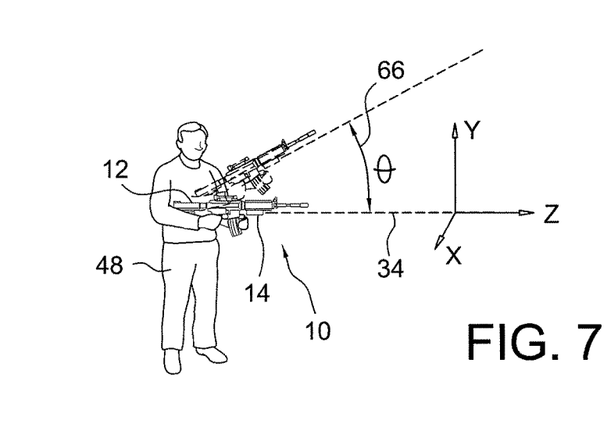
FIG. 7 is still another view of the system shown in FIG. 1.

In each of the embodiments described herein, the gyroscopes 44, accelerometers 46, and/or other components of the motion sensor 42 may be single, double, or triple axis devices. For example, the motion sensor 42 may comprise a two-axis gyroscope 44 configured to sense angular movement (rotation) of the target marker 14 about an X-axis, and about a Y-axis orthogonal to the X-axis. Such exemplary angular movement (rotation) about the Y-axis is illustrated by the arrows 62, 64 shown in FIG. 6. Such exemplary angular movement (rotation) about the X-axis is illustrated by the included angle θ and the arrow 66 illustrated in FIG. 7. For example, as illustrated in FIGS. 6 and 7, the emitted beam 34 may be collinear with a Z-axis. The emitted beam 34 may be disposed in a plane comprising the Z-axis and the X-axis perpendicular to the Z-axis. In such an embodiment, the motion sensor 42 may sense angular movement about at least one of the X-axis and the Y-axis.

Figure 4:
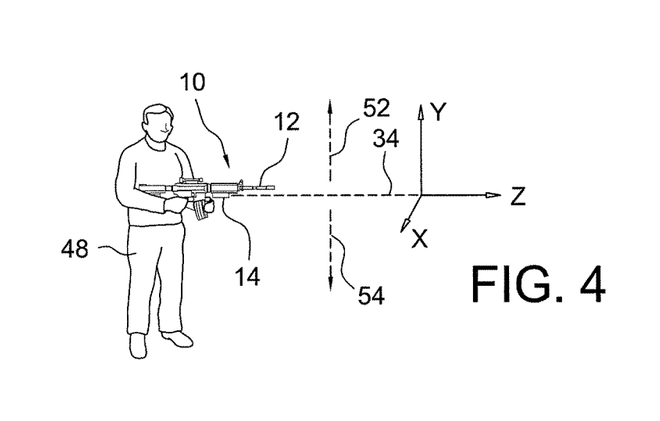
FIG. 4 is another view of the system shown in FIG. 1.
Figure 5:
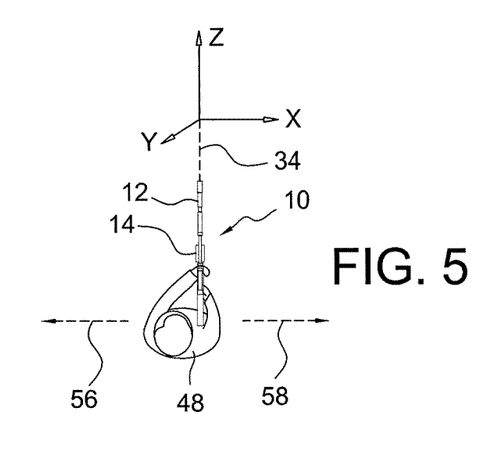
FIG. 5 is a further view of the system shown in FIG. 1.

In additional exemplary embodiments, the motion sensor 42 may comprise a two-axis accelerometer 46 configured to sense linear movement of the target marker 14 along the Y and X axes. Such linear movement may include at least one of a horizontal component and a vertical component. Exemplary vertical components of such linear movement along the Y-axis are illustrated by the arrows 52, 54 shown in FIG. 4. Exemplary horizontal components of such linear movement along the X-axis are illustrated by the arrows 56, 58 of FIG. 5. For example, as illustrated in FIGS. 4 and 5, the emitted beam 34 may be collinear with a Z-axis. The emitted beam 34 may be disposed in a plane comprising the Z-axis and the X-axis perpendicular to the Z-axis. In such an embodiment, the motion sensor 42 may sense linear movement along at least one of the X-axis and the Y-axis.

Although reference is made to the X, Y, and Z axes shown in FIGS. 4-7 for ease of description, it is understood that the motion sensor 42 may comprise components configured to sense movement of the target marker 14 relative to any known orthogonal or non-orthogonal set of axes. for example, the emitted beam 34 may be collinear with a first axis in a plane comprising the first axis and a second axis orthogonal to the first axis. In such an exemplary embodiment, a first component of the sensed movement may be defined along the second axis, and a second component of the sensed movement may be defined along a third axis orthogonal to the plane. Alternatively and/or in addition, sensing movement of the target marker 14 may include sensing an angular movement about an axis orthogonal to the emitted beam 34, such as about the second and/or third axes described above.

In exemplary embodiments in which the motion sensor 42 comprises an image processor 47, the gyroscope 44 and/or the accelerometer 46 may be omitted. Such an exemplary embodiment is illustrated in FIG. 8. The image processor 47 may comprise any device or circuitry configured to detect motion based on an output of the imager 18. Although FIG. 8 illustrates the image processor 47 as being a component of the target marker 14, in further exemplary embodiments, the image processor 47 may be a component of the imager 18. Such an exemplary image processor 47 may be configured to sense movement of the target marker 14 based on a signal generated by one or more components of the imager 18, such as a signal sent from the sensor to the display device. For example, the image processor 47 may be configured to determine whether the field of view of the sensor and/or the imager 18 is moving based on such a signal, and this signal may be sent to the image processor 47 and/or the controller 40 via the connection 19 illustrated in FIG. 8. Although FIG. 8 illustrates the connection 19 as being connected to the controller 40, in further exemplary embodiments, one or more connections 19 may directly connect the imager 18 and/or its components with the image processor 47 via one or more ports 23 of the target marker 14. Such movement of the field of view may be indicative of movement of the target marker 14. The image processor 47 may be configured to send a signal indicative of such movement to the controller 40, and the controller 40 may be configured to modify operation of the beam source 30 based on the signal generated by the image processor 47. It is understood that any number of known algorithms may be utilized by the image processor 47 and/or the controller 40 to determine movement of the field of view. Such a determination may differ from, for example, sensing movement of one or more objects within a substantially stationary field of view in which the imager 18 and/or the target marker 14 is not moving. In still further exemplary embodiments, the image processor 47 may comprise one or more components of the controller 40.

As described above, the motion sensor 42 may be configured to generate a signal indicative of the sensed movement of the target marker 14. Such a signal may be substantially continuously generated by the motion sensor 42, and the signal may be sent to the controller 40 for use in modifying the operation of the beam source 30. In exemplary embodiments comprising more than one beam source 30, 36, each of the beam sources 30, 36 may be controlled based on the one or more signals generated by the motion sensor 42. Alternatively, at least one of the beam sources 30, 36 may be configured to operate independent of the signals generated by the motion sensor 42.

In exemplary embodiments, the controller 40 may calculate the linear and/or angular velocity of the target marker 14 based on this signal. In additional exemplary embodiments, the signal generated by the motion sensor 42 may comprise a voltage or other like signal proportional to the sensed linear and/or angular movement. For example, the signal generated by the motion sensor 42 may comprise a voltage proportional to the linear and/or angular velocity of the target marker 14. In such exemplary embodiments, the motion sensor 42 may be configured to sense the angular and/or linear velocity of the target marker 14. In further exemplary embodiments, the controller 40 may be configured to calculate a change in the angular and/or linear velocity (i.e., an acceleration and/or a deceleration of the target marker 14) based on these sensed velocities. In still further exemplary embodiments, the motion sensor 42 may be configured to sense such acceleration and/or deceleration. As described above with respect to FIGS. 4-7, such sensed linear velocity may have a horizontal component and a vertical component. Such sensed angular velocity may have one or more angular components relative to one or more respective axes.

The target marker 14 can be employed as, for example, a pointer, an aiming device, and/or a designator. A pointer typically encompasses use of the target marker 14 to identify a particular location or entity within a group of entities. An aiming device is typically used in conjunction with a firearm 12 or crew-served weapon, wherein the target marker 14 provides an intended point of impact of an associated projectile. When used as a designator, the target marker 14 is used as or with a target-tracking beam and for providing range data indicative of the range to the target. Thus, "marking" encompasses aiming (aiming from one's own firearm 12), pointing (indicating for other's weapon system), locating (for conventional and coordinate-guided munitions) and/or designating (for beam-guided munitions).

As described above, use of the exemplary target markers 14 described herein as either stand-alone hand-held devices, or as devices coupled to a firearm 12, may be difficult in some situation. For example, it may be challenging to use one or more QCLs or other beam sources 30 described herein in a hand-held or firearm-mounted target marker 14 due to the heat generated by such beam sources 30, the corresponding cooling requirements for efficient functionality, the power requirements of such beam sources 30, and the relative ease with which such an expensive and delicate component may be damaged by sudden jarring, mishandling, accidental dropping, or other like movement. These and other operating requirements specific to such beam sources 30, and QCLs in particular, have made it difficult to utilize such beam sources 30 for the marking, identification, signaling, and/or other operations described herein. The exemplary embodiments of the present disclosure, however, overcome these known obstacles.

For example, the target markers 14 of the present disclosure may be configured to modify the operation of the beam source 30 based on sensed movement of the target marker 14. Modifications to the operation of the beam source 30 may include changes in one or more characteristics of the emitted beam 34 such as, for example, the wavelength, pulse rate, pulse width, and/or duty cycle. In exemplary embodiments, the pulse rate and/or duty cycle of the beam source 30 may be maintained at a minimum desirable level during periods where little or no movement of the target marker 14 is sensed. Such a minimum desirable level may correspond to, for example, a power saving mode or other mode of operation in which a pulsed beam 34 is emitted but the current draw and heat generation by the beam source 30 are minimized.

Upon sensing movement of the target marker 14, the controller 40 may increase the current and/or voltage provided to the beam source 30, and/or may otherwise control the beam source 30 to increase the pulse rate and/or the duty cycle of the emitted beam 34. Once movement of the target marker 14 is no longer sensed, the pulse rate and/or the duty cycle may be reduced to the prior minimum level. Such control may assist in reducing the overall power requirements and heat generation of the beam source 30, while ensuring adequate functionality of the beam source 30 when target marking is required.

In an exemplary method of controlling the target marking system 10, the beam source 30 may emit a pulsed beam 34 having a wavelength in the optical and/or thermal band. The beam 34 may have a minimum pulse rate between approximately 0.5 Hz and approximately 1 Hz and a duty cycle between approximately 5 percent and approximately 10 percent. The motion sensor 42 may sense linear and/or angular movement of the target marker 14, and the controller 40 may modify operation of the beam source 30 based on one or more signals received from the motion sensor 42 indicative of such movement. For example, the controller 40 may increase the pulse rate of the emitted beam 34 to be between approximately 1 Hz and approximately 30 Hz in response to the sensed movement. This pulse rate change may be proportional, stepped, exponential, and/or based on any other desired mathematical relationship between the signals received from the motion sensor 42. Such signals may comprise, for example, horizontal and/or vertical components of sensed linear movement. Such signals may further comprise one or more angular components of angular movement. Such signals may also comprise, for example, a linear and/or an angular velocity (degrees/second) of the target marker 14. Thus, the controller 40 may modify the pulse rate and/or the duty cycle of the emitted beam 34 based on the movement, velocity, and/or acceleration (i.e., an increase and/or decrease in velocity) of the target marker 14, and such movement, velocity, and/or acceleration may be sensed or calculated based on the signals described above.

In exemplary embodiments, the change in pulse rate may be based on an average, peak, sum, and/or any other relationship between the horizontal and vertical components of sensed linear movement. In still further exemplary embodiments, the change in pulse rate may be based on a functional relationship between the signals received from the motion sensor 42. For example, in situations where the target marker 14 is used while the user 48 is walking or running, it may be desirable to modify operation of the beam source 30 based on a functional relationship where the vertical component of the sensed linear movement is minimized and the horizontal component of the sensed linear movement is maximized. Such a functional relationship may reduce undesired modifications related to the walking or running.

In exemplary embodiments, the duty cycle of the beam source may also be increased in response to the sensed movement. For example, the duty cycle may be increased from between approximately 5 percent and approximately 10 percent, to between approximately 25 percent and 50 percent. Such increase in the pulse rate and/or the duty cycle may occur while the pulse width of the emitted beam 34 is kept constant. In further exemplary embodiments, the pulse signature, encoding, encryption, wavelength, and/or other characteristics of the emitted beam 34 may also be modified, and such additional modifications may be independent of the sensed movement of the target marker 14. Once movement of the target marker 14 is no longer sensed, the controller 40 may return the pulse rate and/or duty cycle to their original levels or to any respective intermediate level. Such a return may be proportional, stepped, exponential, and/or based on any of the other relationships described above.

Other exemplary embodiments will be apparent to those skilled in the art from consideration of the specification and practice of the invention disclosed herein. For example, in additional exemplary embodiments, the target marker 14 may further comprise a temperature monitor configured to sense the temperature of the beam source 30 and to trigger an alarm or other like signal if the beam source 30 meets or exceeds a desired temperature threshold. Such a temperature monitor may also be configured to deactivate the beam source 30 and/or to reduce the pulse width and pulse rate of the emitted beam 34 in response to meeting such a threshold. It is intended that the specification and examples be considered as exemplary only, with a true scope and spirit of the invention being indicated by the following claims.

What is claimed is:

1. A target marking system, comprising:
   a target marker, the target marker comprising
      a beam source configured to emit a beam,
      a motion sensor configured to sense movement of the target marker and to generate a signal indicative of the sensed movement, and
      a controller in communication with the beam source and the motion sensor, the controller configured to operate the beam source in a power saving mode when the signal generated by the motion sensor has a first set of characteristics indicating that the target marker is substantially stationary, and to operate the beam source in a target marking mode when the signal generated by the motion sensor has a second set of characteristics different from the first set of characteristics and indicating movement of the target marker.

2. The target marking system of claim 1, wherein the motion sensor comprises at least one of a gyroscope and an accelerometer.

3. The target marking system of claim 1, wherein the motion sensor comprises a two-axis gyroscope configured to sense angular movement of the target marker.

4. The target marking system of claim 3, wherein the signal comprises an output voltage of the gyroscope proportional to an angular velocity of the target marker.

5. The target marking system of claim 1, further comprising a collimating lens positioned in a path of the emitted beam and optically downstream of the beam source.

6. The target marking system of claim 1, further comprising a cooler disposed in thermal contact with the beam source, wherein the cooler is configured to reduce a temperature of the beam source while the beam is emitted.

7. The target marking system of claim 1, wherein the beam source comprises a quantum cascade laser.

8. The target marking system of claim 7, further comprising an additional beam source operably connected to the controller, the additional beam source configured to operate independent of the signal generated by the motion sensor.

9. The target marking system of claim 1, wherein the motion sensor comprises an image processor configured to determine movement of a field of view.

10. The target marking system of claim 9, further comprising an imager, wherein the field of view is a field of view of a component of the imager.

11. The target marking system of claim 1, wherein the operating the beam source in the power saving mode includes reducing at least one of a pulse rate and a duty cycle of a beam emitted by the beam source.

12. The target marking system of claim 1, wherein the second set of characteristics indicates at least one of linear movement and angular movement, and
   operating the beam source in the target marking mode includes increasing at least one of a pulse rate and a duty cycle of a beam emitted by the beam source based at least partly on the at least one of linear movement and angular movement.

13. The target marking system of claim 12, wherein the controller increases the at least one of the pulse rate and the duty cycle based at least partly on an average, peak, or sum of a horizontal component of the linear movement and a vertical component of the linear movement.

14. A target marking system, comprising:
   a target marker configured to be coupled to a firearm, the target marker comprising
      a beam source configured to emit a beam,
      a motion sensor configured to sense movement of the firearm along at least a first axis and a second axis different from the first axis, and to generate a signal indicative of the sensed movement, and
      a controller in communication with the beam source and the motion sensor, the controller configured to operate the beam source in response to the signal generated by the motion sensor, wherein:
         the controller causes the beam source to emit a first beam having a first pulse rate or a first duty cycle in response to sensed movement along the first axis, and
         the controller causes the beam source to emit a second beam having a second pulse rate or a second duty cycle in response to sensed movement along the first and second axes.

15. The target marking system of claim 14, wherein the sensed movement along the first and second axes indicates at least one of walking and running of a person bearing the firearm.

16. The target marking system of claim 15, wherein the sensed movement along the first axis reduces a relative contribution of the sensed movement along the second axis when the controller causes the beam source to emit the first beam.

* * * * *